United States Patent
Korich et al.

(10) Patent No.: US 7,641,490 B2
(45) Date of Patent: Jan. 5, 2010

(54) LIQUID-COOLED INVERTER ASSEMBLY

(75) Inventors: Mark D. Korich, Chino Hills, CA (US); Gregory S. Smith, Woodland Hills, CA (US); George John, Cerritos, CA (US); David Tang, Fontana, CA (US); Karl D. Conroy, Huntington Beach, CA (US)

(73) Assignee: GM Global Technology Operations, Inc., Detroit, MI (US)

( * ) Notice: Subject to any disclaimer, the term of this patent is extended or adjusted under 35 U.S.C. 154(b) by 0 days.

(21) Appl. No.: 11/959,176

(22) Filed: Dec. 18, 2007

(65) Prior Publication Data

US 2009/0154101 A1  Jun. 18, 2009

(51) Int. Cl.
*H01R 4/64* (2006.01)
(52) U.S. Cl. ..................... 439/196
(58) Field of Classification Search ............... 439/196, 439/487; 336/57; 363/141, 131; 361/704, 361/707, 709, 710, 801
See application file for complete search history.

(56) References Cited

U.S. PATENT DOCUMENTS

| | | | |
|---|---|---|---|
| 5,715,141 A * | 2/1998 | Karlsson | 361/707 |
| 6,359,331 B1 * | 3/2002 | Rinehart et al. | 257/691 |
| 7,057,308 B2 * | 6/2006 | Stranberg et al. | 307/66 |
| 7,248,483 B2 * | 7/2007 | West | 361/801 |
| 7,471,534 B2 * | 12/2008 | Andersson et al. | 363/141 |
| 7,477,513 B1 * | 1/2009 | Ceder et al. | 361/699 |
| 2006/0239050 A1 * | 10/2006 | Andersson et al. | 363/132 |
| 2008/0174393 A1 * | 7/2008 | Schnetzka et al. | 336/57 |
| 2008/0225482 A1 * | 9/2008 | Smith et al. | 361/699 |

* cited by examiner

*Primary Examiner*—Chandrika Prasad
(74) *Attorney, Agent, or Firm*—Ingrassia Fisher & Lorenz, PC

(57) ABSTRACT

An inverter assembly includes a housing and a substrate disposed in the housing. The substrate includes at least a first conductive layer patterned to include an alternating current (AC) path and a direct current (DC) path. A plurality of inverter switches is mounted on the substrate and electrically coupled to the AC path and the DC path.

18 Claims, 4 Drawing Sheets

LIQUID-COOLED INVERTER ASSEMBLY

TECHNICAL FIELD

The present invention generally relates to a liquid-cooled inverter and, more particularly, to a liquid-cooled inverter assembly of the type employed in an electric or hybrid vehicle.

BACKGROUND OF THE INVENTION

Inverter assemblies are commonly employed in hybrid and electric vehicles to provide three phase operating power to an electric drive motor. In general, such inverter assemblies include a plurality of inverter switches mounted on a substrate. The inverter switches are electrically coupled between a direct current (DC) power source, such as a battery, and the electric drive motor by way of a bus bar. A capacitor may be electrically coupled between the bus bar and the DC power source to regulate fluctuations in voltage; however, depending upon the proximity of the capacitor to the switches, the capacitor may potentially induce voltage overshoots in the system. The inverter switches oscillate between open and closed positions to convert the direct current into alternating current (e.g., three phase alternating current) suitable for driving the vehicle's electric drive motor.

During operation of the inverter assembly, the inverter switches, the bus bar, and the capacitor generate heat and may consequently require thermal regulation to ensure proper functioning. For this reason, the inverter assembly may be provided with a liquid-cooling system, which actively circulates a dielectric coolant fluid over the active switches. However, the dielectric fluid may not contact and cool the bus bar, which is spatially offset from the substrate and the inverter switches. As a result, the liquid-cooling system may not achieve optimal cooling.

It should thus be appreciated that it would be desirable to provide a liquid-cooled inverter assembly having a substrate with an integrated bus bar wherein the cooling system directs coolant over the inverter switches, the substrate, and the integrated bus bar to thereby cool the inverter assembly in a more efficient manner. It would also be desirable if the liquid-cooled inverter assembly included a capacitor and a means for the cooling thereof (e.g., a heat sink). Preferably, the liquid-cooled inverter assembly would be configured such that the capacitor resides proximate the substrate and inverter switches so as to minimize inductive interference. Furthermore, other desirable features and characteristics of the present invention will become apparent from the subsequent detailed description and the appended claims, taken in conjunction with the accompanying drawings and the foregoing technical field and background.

SUMMARY OF THE INVENTION

An inverter assembly includes a housing and a substrate disposed in the housing. The substrate includes at least a first conductive layer patterned to include an alternating current (AC) path and a direct current (DC) path. A plurality of inverter switches is mounted on the substrate and electrically coupled to the AC path and the DC path.

DESCRIPTION OF THE DRAWINGS

The present invention will hereinafter be described in conjunction with the following drawing figures, wherein like numerals denote like elements, and.

DESCRIPTION OF AT LEAST ONE EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary, or the following detailed description.

Figure 1:
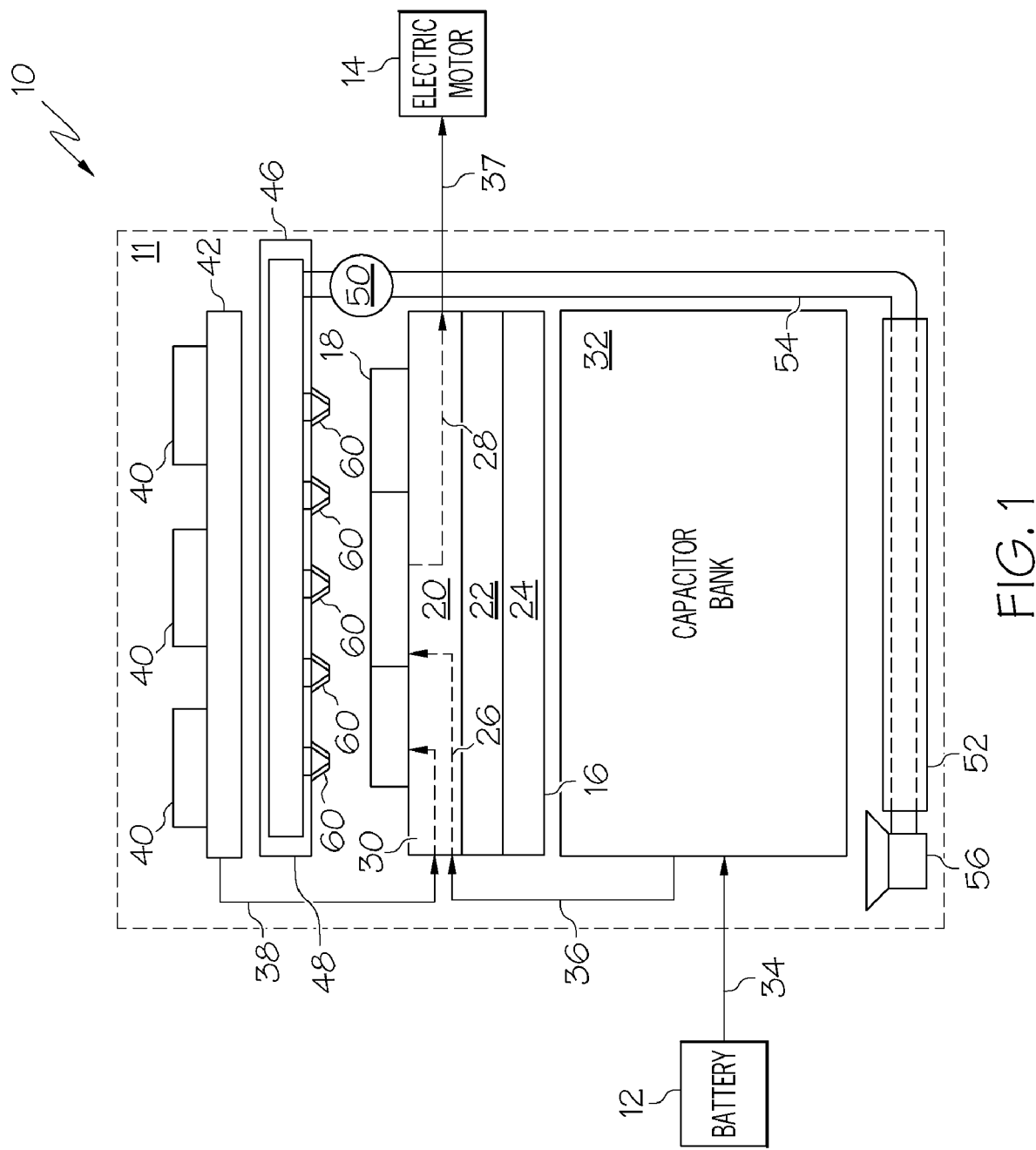
FIG. 1 is a simplified functional view of an electric drive system employing a liquid-cooled inverter assembly in accordance with a first exemplary embodiment of the present invention.

FIG. 1 is a simplified functional view of an electric drive system 10 employing a liquid-cooled inverter assembly 11 in accordance with a first exemplary embodiment of the present invention. Inverter assembly 11 is coupled between a direct current (DC) power source 12 (e.g., one or more batteries and/or fuel cells) and an electric motor 14 of the type deployed on an electric or hybrid vehicle (e.g., a three phase motor). Inverter assembly 11 converts direct current supplied by battery 12 into an alternating current (AC) suitable for driving electric motor 14. In particular, inverter assembly 11 may provide three phase operating power to electric motor 14.

Inverter assembly 11 includes a multi-layer substrate 16, which supports a plurality of power semiconductor devices (e.g., inverter switches) 18. In the illustrated exemplary embodiment, substrate 16 includes three layers: a top conductive layer 20 (e.g., copper), a middle insulative layer 22 (e.g., a ceramic, such as aluminum oxide or silicon nitride), and a bottom conductive layer 24 (e.g., copper). Switches 18 are preferably soldered to top conductive layer 20, although it should be appreciated that other attachment means may be utilized. A current-carrying bus bar is integrated into at least one layer of multi-layer substrate 16. For example, top conductive layer 20 may be patterned to include a bus bar, which carries current to and from inverter switches 18. More specifically, top conductive layer 20 may be patterned to include at least two current paths; i.e., a DC path 26 and an AC path 28. If desired, top conductive layer 20 may also be patterned to include a control signal path 30.

As shown in FIG. 1, DC path 26 may be coupled to battery 12 via electrical connections 34 and 36, and AC path 28 may be coupled to electric motor 14 via electrical connection 37. A third electrical connection 38 may further couple control signal path 30 to control circuitry 40 mounted on, for example, a printed circuit board (PCB) 42 (e.g., a gate driver board). In one option, control circuitry 40 and PCB 42 are combined into a single circuit card. During the operation of inverter assembly 11, control circuitry 40 sends control signals over connection 38 and path 30, which command switches 18 to alternate between open and closed positions so as to convert the direct current received from battery 12 into alternating current suitable for driving electric motor 14.

A capacitor bank 32 may be electrically coupled between battery 12 and DC path 26 of conductive layer 20 to regulate voltage fluctuations (e.g., smooth out any voltage spikes) that may be produced by battery 12. In the illustrated exemplary embodiment, battery 12 is coupled to capacitor bank 32 by way of a first electrical connection 34, and capacitor bank 32 is coupled to DC path 26 by way of a second electrical connection 36. As indicated in FIG. 1, capacitor bank 32 may be combined with the other components of inverter assembly 11 into a single module. In this case, capacitor bank 32 is preferably positioned proximate substrate 16 and inverter switches 18. For example, capacitor bank 32 may be positioned such that its upper surface resides adjacent, and possibly contacts, a surface of substrate 16 (e.g., the lower surface of lower conductive layer 24). By positioning capacitor bank 32 near substrate 16 and inverter switches 18 in this manner, inductive interference may be minimized. This example notwithstanding, it should be appreciated that capacitor bank 32 may be positioned at other locations within the inverter module or, alternatively, capacitor bank 32.

During operation of inverter assembly 11, heat is generated by active inverter switches 18. In addition, heat may be produced in substrate 16 and capacitor bank 32. To dissipate this heat, substrate 16 may be placed in physical contact with another body. For example, lower conductive layer 24 may be mounted to the vehicle's chassis. In this manner, the temperature of inverter switches 18 and patterned upper conductive layer 20 may be regulated as heat conductively travels from conductive layer 20, through insulative layer 22 and lower conductive layer 24, and into the vehicle's chassis (or other such body). In addition, capacitor bank 32 may also be placed in physical contact with substrate 16 (e.g., lower conductive layer 24) so that the heat generated thereby may be dissipated in a similar manner.

To further increase heat dissipation, inverter assembly 11 may be equipped with a liquid-cooling system 46. Liquid-cooling system 46 is configured to circulate a coolant fluid over active inverter switches 18 to convectively cool switches 18. This coolant fluid may also contact, and thus convectively cool, patterned conductive layer 20 of multi-layer substrate 16. The coolant fluid circulated by liquid-cooling system 46 is preferably a dielectric liquid (e.g., fluorocarbon, silicone oil, or polyalphaolephin), although it will be appreciated that the particular coolant fluid selected will depend upon device chemistry and application.

Liquid-cooling system 46 includes an outlet array 48, a pump 50, a cooling device 52, and a flow passage 54 including an inlet or fluid pick-up 56. Outlet array 48 may be formed from a variety of materials, including, but not limited to, various metals (e.g., aluminum, copper, etc.), alloys, and plastics (e.g., an injection-molded plastic). Outlet array 48 includes an internal conduit 58 and a plurality of impingement outlets 60 each fluidly coupled to conduit 58. In one arrangement, outlet array 48 is disposed beneath PCB 42 and over switches 18 and substrate 16. Impingement outlets 60 are positioned so as to direct circulating coolant fluid onto the top surfaces of active inverter switches 18 and/or patterned conductive layer 20 of substrate 16; e.g., each of outlets 60 may be disposed substantially above a different one of inverter switches 18.

Impingement outlets 60 may assume any form suitable for directing circulating coolant fluid onto switches 18 and/or substrate 16. For example, impingement outlets 60 may each take the form of one or more holes created through the underside of outlet array 48. However, impingement outlets 60 each preferably comprise a fluid flow jet configured to create a stream of coolant fluid, or a spray nozzle configured to produce a fine or atomized mist. Embodiments of outlet array 48 may employ fluid flow jets, spray nozzles, or a combination of jets and nozzles depending upon desired performance characteristics. Spray nozzles tend to provide more efficient thermal cooling, while fluid flow jets help to preserve coolant fluid quality and may permit pump 50 to be of the low pressure variety thereby reducing cost and increasing system reliability.

When pump 50 is energized, coolant fluid flows through flow passage 54, into outlet array 48, and over inverter switches 18 and substrate 16. As the coolant fluid contacts switches 18 and substrate 16, heat is convectively transferred from the active inverter switches 18 and upper conductive layer 20 to the coolant fluid. The heated fluid is then collected at fluid pick-up 56 and drawn through flow passage 54 by pump 50. Cooling device 52 cools the heated coolant fluid as it flows through flow passage 54. Cooling device 52 may comprise any device suitable for this purpose, including, but not limited to, various types of heat exchangers and heat sinks. Next, the cooled coolant fluid enters the inlet port of outlet array 48. The coolant fluid flows along conduit 58 to impingement outlets 60, which then direct the coolant fluid over the active inverter switches 18 and substrate 16. This cycle is repeated to continually regulate the temperature of switches 18 and substrate 16. By integrating the bus bar into substrate 16, inverter assembly 11 permits liquid-cooling system 46 to simultaneously cool inverter switches 18 and current-carrying components of inverter assembly 11, which increases the effectiveness of liquid-cooling system 46 and consequently the overall performance of inverter assembly 11.

Depending upon the temperature of inverter switches 18 and the characteristics of the chosen coolant fluid, some portion of the circulated coolant fluid may vaporize upon contacting inverter switches 18. In this case, inverter assembly 11 may be provided with a condenser (not shown), which condenses the vaporized coolant fluid. The condensed coolant fluid then returns to the coolant fluid reservoir and is recirculated in the manner described above.

Figure 2:
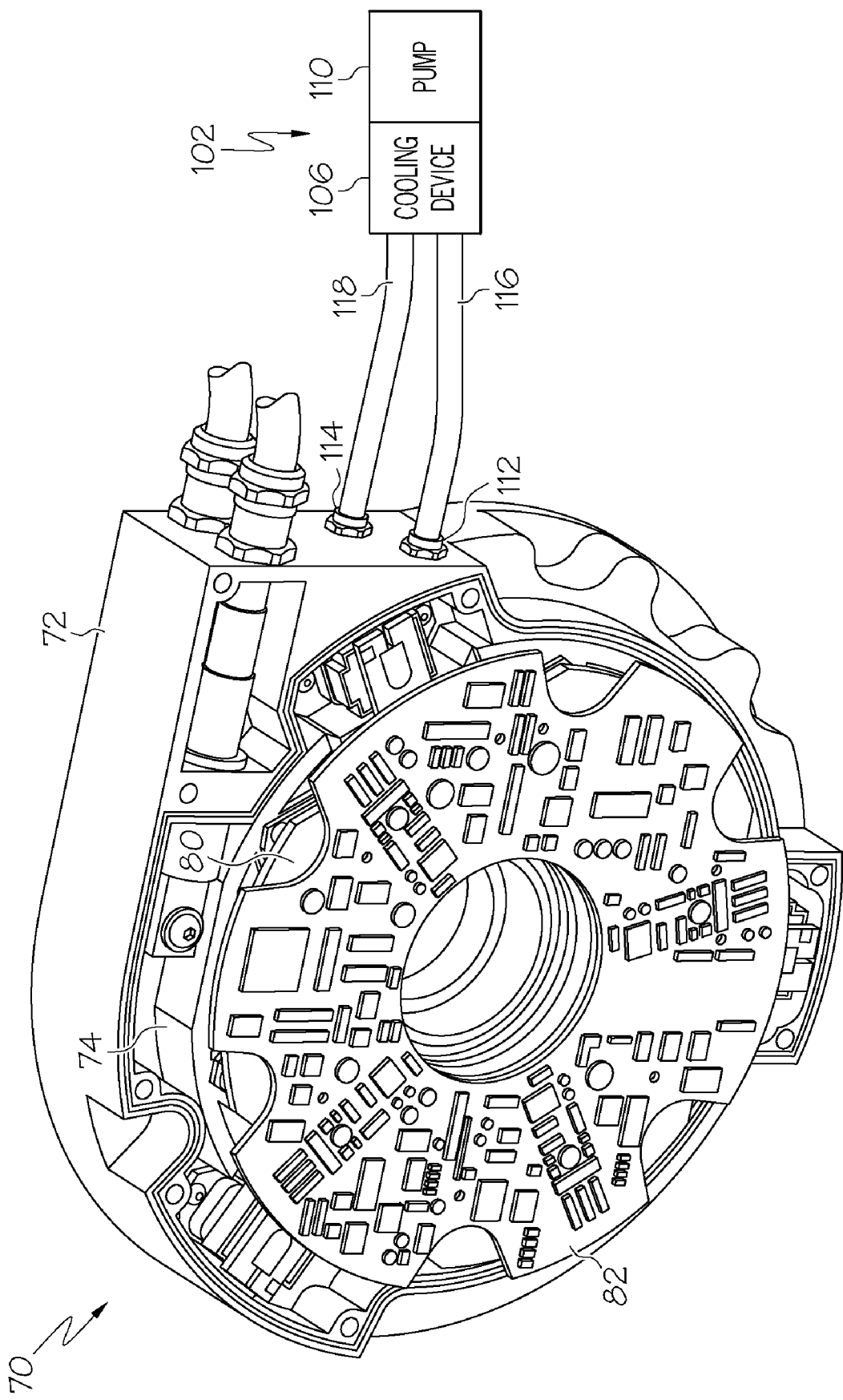
FIGS. 2 and 3 are isometric and exploded views, respectively, of a liquid-cooled inverter assembly in accordance with a second exemplary embodiment of the present invention.
Figure 3:
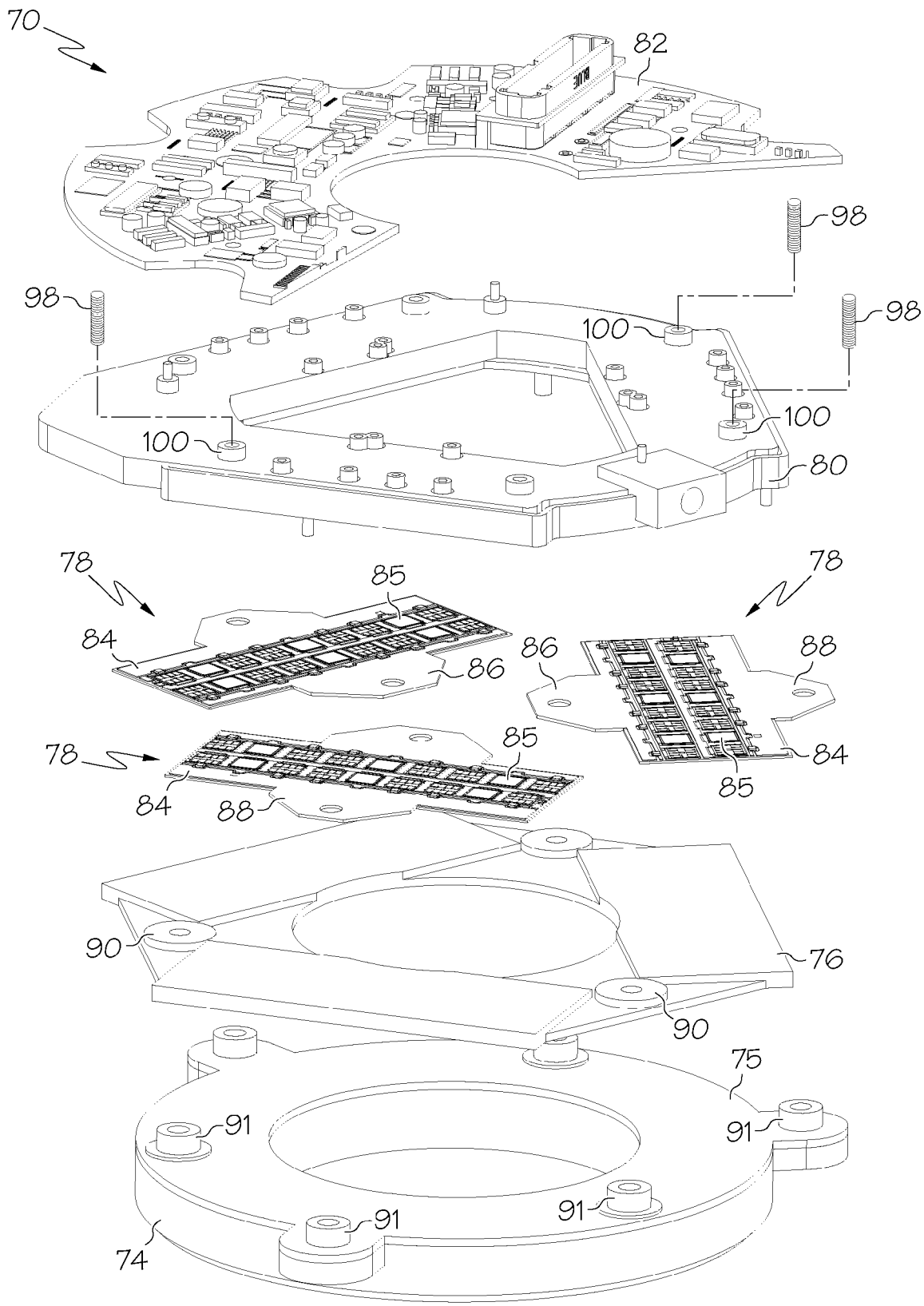

FIGS. 2 and 3 are isometric and exploded views, respectively, of a liquid-cooled inverter assembly 70 in accordance with a second exemplary embodiment of the present invention. Inverter assembly 70 includes a housing 72 (FIG. 2), which may plastic or another suitable material. As shown in FIG. 3, liquid-cooled inverter assembly 70 may include a capacitor bank 74 including a cover 75, a conductive mount plate 76, a plurality of inverter devices 78, an annular outlet array (e.g., a spray array) 80, and a gate driver board 82, which may be disposed within housing 72 in a stacked configuration as described (housing 72 and a pie-shaped section of gate driver board 82 and of spray array 80 are not shown in FIG. 3 for clarity).

Inverter devices 78 (FIG. 3) each include a multi-layer substrate 84, which supports a plurality of power semiconductor devices (e.g., switches 85). As was the case previously, each substrate 84 includes a bus bar integrally formed thereon, which includes an AC path, a DC path, and a control signal path. The AC path includes an AC terminal 86, which may reside on an inner tab of substrate 84 in the manner illustrated in FIG. 3. The DC path includes first and second DC terminals 88 and 90 having opposite polarities (e.g., DC terminals 88 may be positive, and DC terminals 90 may be negative). In the illustrated exemplary embodiment, each DC terminal 88 resides on an outer tab of substrate 84, and each DC terminal 90 resides on conductive mount plate 76, which functions as a current carrying bus-structure electrically coupled to substrate 84. This example notwithstanding, DC terminal 90 may be incorporated directly into substrate 84 and mount plate 76 may be removed from inverter assembly 70 in alternative embodiments. In this case, each substrate 84 may be placed in direct physical contact with cover 75 to heat sink capacitor bank 74.

Figure 4:
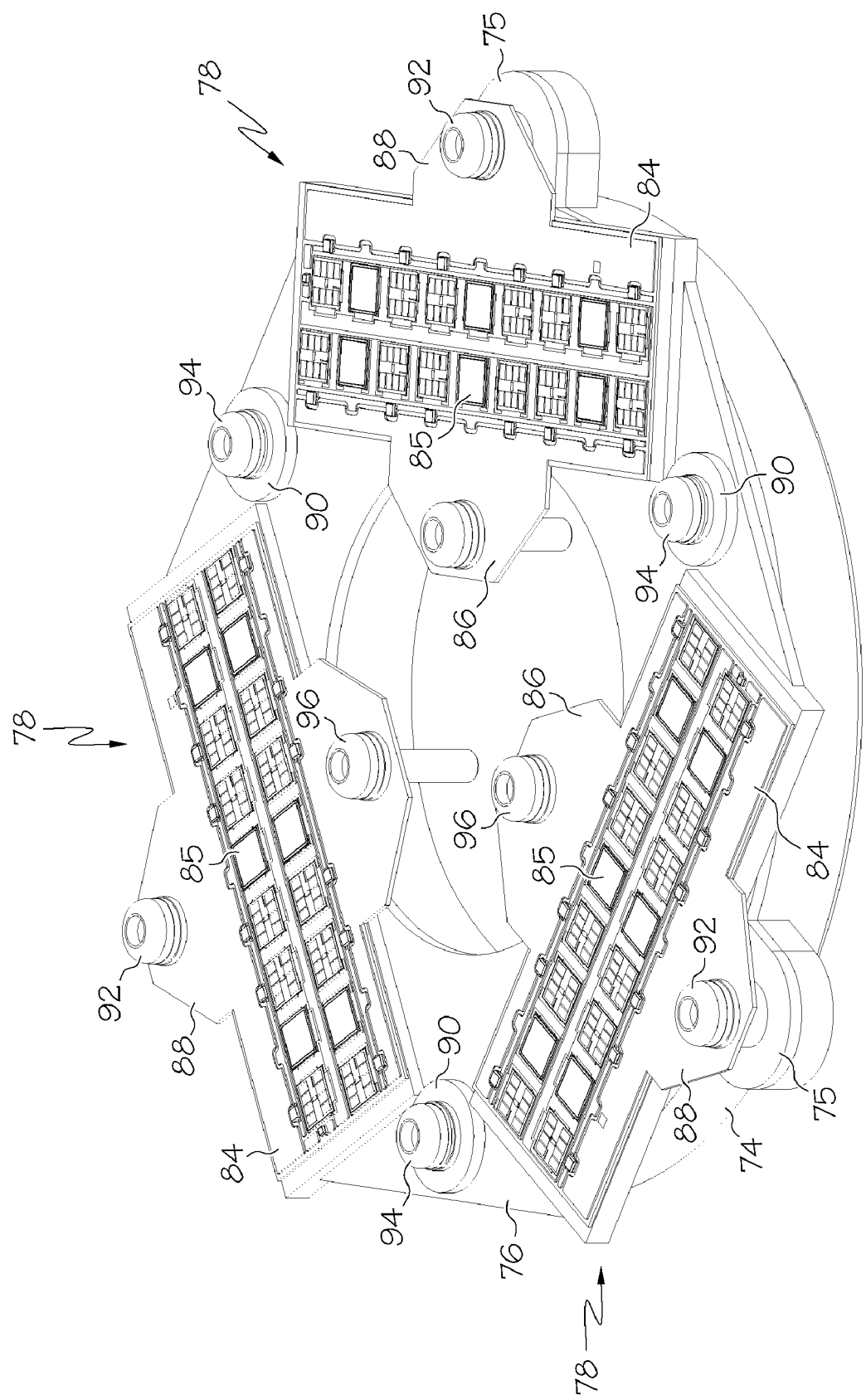
FIG. 4 is an isometric view of the inverter devices, mount plate, and capacitor of the liquid-cooled inverter assembly shown in FIGS. 2 and 3 in an assembled state.

FIG. 4 is an isometric view of inverter devices 78, substrates 84, mount plate 76, and capacitor bank 74 in an assembled state. As can be seen, inverter devices 78 are disposed upon substrates 84, which, in turn, are disposed upon the upper surface of cover 75. First and second pluralities of conductive lugs 92 and 94 are disposed through the apertures provided through DC terminals 88 and 90, respectively. Lugs 92 and 94 extend through a plurality of channels 91 provided through cover 75 to electrically couple the integrated bus of each substrate 84 to capacitor bank 74. Capacitor bank 74 is, in turn, coupled to a direct current source (not shown), such as a battery of the type described above in conjunction with FIG. 1. A third plurality of conductive lugs 96 extends through the apertures provided through AC terminals 86. The exposed ends of the conductive lugs 96 are electrically coupled to an electric motor (not shown). As an example, housing 72 (FIG. 2) may be mounted on the electrical motor (e.g., bolted to the bell end of the motor) and exposed conductive lugs 92 may be electrically coupled to the windings thereof.

As described previously, gate driver board 82 (FIGS. 2 and 3) commands switches 85 to oscillate between open and closed positions. To enable command signals to be sent from gate driver board 82 to switches 85, at least one electrical connection is formed between gate driver board 82 and the patterned conductive layer (or layers) of substrate 84. In the exemplary embodiment illustrated in FIG. 3, a plurality of spring pins 98 are utilized to electrically couple board 82 to the patterned conductive layer of substrate 84. Each spring pin 98 may pass through a guide channel 100 provided through spray array 80. When inverter assembly 70 is assembled, spring pins 98 are compressed between a lower surface of gate driver board 82 and an upper surface (i.e., the patterned surface) of substrate 84. If desired, spring pins 98 may be soldered or welded to gate driver board 82 and/or substrate 84, although such a rigid coupling is by no means necessary. In addition, it should be appreciated that other electrical connections means may be utilized including, for example, wires and straight pins, which may pass through, or may be routed around, spray array 80. Alternatively, the electrical connections may comprise a tab extending from each substrate 84, which may be bent upward to contact gate driver board 82 and possibly soldered thereto.

Referring collectively to FIGS. 2 and 3, spray array 80 is positioned within housing 72 so as to direct coolant fluid over inverter devices 78 and substrates 84 (e.g., spray array 80 may be disposed above inverter devices 78 as shown in FIG. 3). To provide spray array 80 with a continuous coolant supply, inverter assembly 70 may be coupled to a coolant circulation system 102 (FIG. 2), which continually exchanges coolant with inverter assembly 70. In one option, coolant circulation system 102 comprises a cooling device (e.g., a heat exchanger) 106 and a pump 110. Coolant circulation system 102 is coupled to an inlet 112 and an outlet 114 provided on inverter assembly 70 by way of a fluid delivery tube 116 and a fluid removal tube 118, respectively. Coolant circulation system 102 removes heated coolant fluid from assembly 70 via fluid removal tube 118, cools the heated coolant fluid, and then returns the fluid via fluid delivery tube 116. The cooled coolant fluid received at inlet 112 is provided to spray array 80, which then directs the fluid over inverter devices 78 and substrate 84 in the manner described above. This example notwithstanding, it should be appreciated that cooling device 106 and, perhaps, other components of coolant circulation system 102 may be incorporated into inverter assembly 70 (e.g., built into the cover of the unit).

The integration of a bus bar into each substrate 84 permits spray array 80 to simultaneously direct coolant fluid over inverter switches 85 and the current-carrying layer of substrate 84. This increases the thermal efficiency of the liquid cooling system and, therefore, the overall performance of liquid-cooled inverter assembly 70. In addition, conductive mount plate 76 may be placed in contact with cover 75 and consequently serve as a heat sink for capacitor bank 74. As further advantage, the coolant may contact, and thus convectively cool, mount plate 76. As a still further advantage, capacitor bank 74 is positioned in close proximity to inverter switches 85 (e.g., the upper surface of capacitor bank 74 resides adjacent mount plate 76 and near the lower surface of substrate 84), which minimizes the likelihood of electrical interference due to inductance.

It should thus be appreciated that there has been provided a liquid-cooled inverter assembly employing a substrate with an integrated bus bar that achieves greater thermal efficiency by cooling the inverter switches and the substrate/bus bar. In one option, the liquid-cooled inverter assembly employs a capacitor, which is cooled (e.g., placed in contact with a heat sink, such as a mount plate or a surface of the substrate) and which resides proximate the inverter switches so as to minimize inductive interference.

Although the foregoing has described substrates having a conductive layer (or layers) patterned to include an AC path, a DC path, and a control circuit path, it will be appreciated by those skilled in the art that the patterned conductive layer need not include a control circuit path; instead, the control circuitry may be connected to the inverter switches through an emitter or collector disposed on the substrate (e.g., via a spring pin of the type described above in conjunction with FIG. 3).

While at least one exemplary embodiment has been presented in the foregoing detailed description, it should be appreciated that a vast number of variations exist. It should also be understood that the embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An inverter assembly, comprising:
    a housing;
    a substrate disposed in the housing and including at least a first conductive layer patterned to include an alternating current (AC) path and a direct current (DC) path;
    a plurality of inverter switches mounted on the substrate and electrically coupled to the AC path and the DC path;
    a cooling system including an outlet array coupled to the housing, the outlet array positioned so as to direct coolant fluid over the substrate and the plurality of inverter switches; and
    a capacitor disposed within the housing and electrically coupled to the DC path, the substrate and the plurality of inverter switches residing between the capacitor and the outlet array;
    wherein AC path and the DC path are formed on the same conductive layer of the substrate.

2. An inverter assembly according to claim 1 wherein the first conductive layer is further patterned to include a control signal path to which the plurality of inverter switches is electrically coupled.

3. An inverter assembly according to claim 1 wherein the plurality of inverter switches is mounted on the first conductive layer.

4. An inverter assembly according to claim 1 wherein the first conductive layer is the top layer of the substrate.

5. An inverter assembly according to claim 1 wherein the capacitor contacts a surface of the substrate.

6. An inverter assembly according to claim 1 further comprising a conductive mount plate residing between the substrate and the capacitor.

7. An inverter assembly according to claim 6 wherein the conductive mount plate includes a first surface and a second surface opposite the first surface, the first surface contacting the substrate and the second surface contacting the capacitor.

8. An inverter assembly according to claim 1 wherein the substrate further comprises:
  a second conductive layer; and
  an insulative layer disposed between the first conductive layer and the second conductive layer.

9. An inverter assembly according to claim 2 further comprising:
  control circuitry disposed above the outlet array; and
  a plurality of electrical connectors electrically coupling the control circuitry to the control signal path, the plurality of electrical connectors extending through the outlet array.

10. An inverter assembly according to claim 9 wherein the control circuitry comprises a gate driver board, and wherein the plurality of electrical connectors comprises a plurality of spring pins compressed between the gate driver board and the substrate.

11. A liquid-cooled inverter assembly for use in conjunction with a direct current (DC) power source and an electric motor, the liquid-cooled inverter assembly comprising:
  a housing;
  at least one inverter device disposed within the housing, the inverter device comprising:
    a substrate including an integrated bus bar having an alternating current (AC) path configured to be coupled to the electric motor and a DC path configured to be coupled to the DC power source; and
    a plurality of inverter switches mounted on the substrate and electrically coupled to the AC path and to the DC path;
  a cooling system coupled to the housing and configured to direct a coolant fluid over the substrate and the plurality of inverter switches;
  a capacitor disposed within the housing and electrically coupled to the DC current path; and
  a conductive mount disposed within the housing between the capacitor and the inverter device, the inverter device residing on and electrically coupled to the conductive mount plate.

12. A liquid-cooled inverter assembly according to claim 11 further comprising control circuitry disposed in the housing, the bus bar further including a control circuit path electrically coupling the control circuitry to the plurality of inverter switches.

13. A liquid-cooled inverter assembly according to claim 11 wherein the substrate includes a first tab, and wherein the AC path includes an AC terminal residing on the first tab.

14. A liquid-cooled inverter assembly according to claim 13 wherein the substrate further includes a second tab, and wherein the DC path includes a DC terminal residing on the second tab.

15. A liquid-cooled inverter assembly according to claim 11 wherein the conductive mount plate includes at least one DC terminal thereon, the DC terminal electrically coupled to the DC path.

16. A liquid-cooled inverter assembly according to claim 11 wherein the capacitor contacts the conductive mount plate substantially opposite the inverter device.

17. An electric drive system for use in a hybrid or electric vehicle, the electric drive system comprising:
  a direct current (DC) power source;
  an electric motor; and
  an inverter module, comprising:
    a housing;
    control circuitry disposed within the housing;
    a substrate including at least one conductive layer patterned to include an alternating current (AC) path coupled to the electric motor, a DC path coupled to the DC power source, and a control signal path coupled to the control circuitry;
    a plurality of inverter switches mounted on the substrate and electrically coupled to the AC path, to the DC path, and to the control signal path; and
    a cooling system coupled to the housing and configured to direct a coolant fluid over the substrate and the plurality of inverter switches;
  wherein the AC path, the DC path, and the control signal path comprise a current-carrying bus bar integrated into the uppermost layer of the substrate.

18. An electric drive system according to claim 17 further comprising a capacitor electrically coupled between the DC power source and the DC path, the capacitor disposed within the housing proximate the substrate.

* * * * *